United States Patent
Yao

[19]

[11] Patent Number: 6,057,921
[45] Date of Patent: May 2, 2000

[54] TWO PIECE MIRROR ARRANGEMENT FOR INTERFEROMETRICALLY CONTROLLED STAGE

[75] Inventor: Shi-kay Yao, El Monte, Calif.

[73] Assignee: Etec Systems, Inc., Hayward, Calif.

[21] Appl. No.: 09/106,917

[22] Filed: Jun. 29, 1998

Related U.S. Application Data

[60] Provisional application No. 60/052,789, Jul. 8, 1997.

[51] Int. Cl.[7] ..................................................... G01B 9/02
[52] U.S. Cl. ......................... 356/358; 356/400; 356/401; 356/363
[58] Field of Search .................................... 356/363, 401, 356/358, 400

[56] References Cited

U.S. PATENT DOCUMENTS

| | | | |
|---|---|---|---|
| 5,151,749 | 9/1992 | Tanimoto et al. | 356/375 |
| 5,363,196 | 11/1994 | Cameron | 356/358 |
| 5,523,841 | 6/1996 | Nara et al. | 356/358 |

FOREIGN PATENT DOCUMENTS

| | | | |
|---|---|---|---|
| WO 89/05955 | 6/1989 | WIPO | G01B 9/02 |

*Primary Examiner*—Robert H. Kim
*Attorney, Agent, or Firm*—Skjerven, Morrill, MacPherson, Franklin & Friel LLP; Norman R. Klivans

[57] ABSTRACT

Two axes laser interferometers are well known for determining the XY position of a stage, for instance for photolithography equipment. Each of the X and Y coordinates is measured to great precision by reflecting a laser beam from a long flat mirrored surface lying perpendicular to the axis of interest. Instead of using a single one-piece mirror having two reflective surfaces, three mirrors are provided in the configuration of two independent rigid bodies; there are two extended main mirrors each of which is formed on a separate optical element and a third smaller calibration mirror which is fabricated at a right angle at the end surface of one of the long mirrors or is adhesively bonded or held mechanically thereto. The angular relationship between the calibration mirror and the mirror to which it is attached is rigid and the orthogonality error is calibrated and recorded. This calibration mirror is a reference surface for the second elongated mirror to which it is nominally parallel. By use of the interferometer in a calibration mode, it can be determined if the calibration mirror is parallel or not to the nominally parallel main mirror and thus it can be determined if the two main mirrors are exactly orthogonal, and to the extent they depart therefrom a calibration correction can be made. This insures accurate measurement of the XY position of the stage.

7 Claims, 2 Drawing Sheets

TWO PIECE MIRROR ARRANGEMENT FOR INTERFEROMETRICALLY CONTROLLED STAGE

CROSS REFERENCE TO RELATED APPLICATION

This application claims priority to U.S. provisional patent application Ser. No. 60/052,789, filed Jul. 8, 1997.

BACKGROUND OF THE INVENTION

1. Field of the Invention

This invention relates to movable stages and other precision location mechanisms and more specifically to an improved mirrored arrangement for a stage whose position is determined by an interferometer.

2. Description of the Prior Art

It is well known to use an interferometer arrangement to determine and control the position in the XY axes of a movable mechanical stage, for instance in high resolution microlithography applications. FIG. 1 shows in a plan view a stage 10 capable of moving in the X and Y axes. (The X and Y axes shown are not a structural element but merely for orientation purposes). Stage 10 is conventionally driven along both the Y and X axes. Typically this is accomplished by linear motors, a first set of linear motors providing the X direction motion and a second set of linear motors providing the Y direction motion. For instance, the stage powered by linear motors may be moved back and forth in the Y direction on a mechanical guide beam which in turn is moved and powered by linear motors in the X direction along guide rails. This provides the desired independent two direction motion.

Such a stage 10 supports for instance an integrated circuit wafer so that the wafer can be precisely positioned for lithography. Similar arrangements are used in other photolithographic applications, for instance for defining conductive patterns on a laminate which is a substrate for a large printed circuit board. In this case, located on stage 10, is a chuck (not shown) or other holding mechanism arrangement for holding the substrate (work piece). Other elements conventionally present on such a stage include fiducial marks and mechanisms for moving the chuck rotationally and up or down. These other elements also are not shown.

It is to be understood that also not shown are the remaining elements of the photolithographic system including an optical system for providing a light beam which is incident on the work piece located on stage 10, for imaging purposes. This optical system typically is located above the plane of the drawing. Also, the stage 10 typically moves on a large flat surface (not shown) and is supported thereon by air bearings or mechanical ball/roller bearings.

The interferometer system, to which the present invention is directed, in the prior art includes a one-piece large triangular (or rectangular or L-shaped) mirror 12, having two reflective surfaces M1 and M2. The single piece triangular or rectangular mirror 12 is carefully fabricated to subtend a 90 degree angle as shown between reflective surfaces M1 and M2. It is understood that typically the interferometry laser beams are in the visible wavelength spectrum and hence surfaces M1, M2 are reflective in the visible spectrum, but this is not limiting.

In this example, incident upon the so-called X direction surface M1, are two laser beams 16 and 18. In another embodiment only one laser beam is incident on surface M1. Use of two beams provides not only linear position data but also angular rotation data of the reflective surface. These beams 16, 18 are provided from interferometer mount 14. Typically there it is not an individual laser which provides each beam 16, 18 but instead a single laser coupled with a beam splitter provides the multiple beams. Note that for each laser beam, 16 or 18, there will be a corresponding reflected beam from the mirror M1 going back towards the interferometer mount, 14.

Also included in the interferometer mount 14 are optics and a high speed photodetector suitable for receiving the beams reflected back from mirror surface M1. These receiving optics, which are also conventional, generate the interferometer signal between each outgoing and received (reflected) interferometer laser beam and thereby determine the motion and thus the relative location in the X direction of reflective surface M1 by electronic analysis of the resulting interferometer signal and thereby the position of the attached stage 10 and of course the work piece.

A similar procedure is undertaken for determining the stage location in the Y direction using Y direction laser beams 26 and 28 incident on reflective surface M2 and reflected back to receiving optics at Y direction interferometer mount 24.

In order to maintain high precision, the orthogonality of the two reflective surfaces M1 and M2 must be nearly perfect. This is conventionally accomplished using a one piece solid triangular or rectangular or L-shaped mirror structure 12.

This arrangement works well for integrated circuit fabrication applications where a typical size of the wafer (work piece) is typically no more than 8 inches in diameter and the resulting length of each side of the stage 10 and hence mirror 12 is perhaps 12 inches. However, the present inventors have found that for applications where the stage 10 is intended to support a substantially larger substrate and hence the stage is scaled up substantially in size, the single piece mirror 12 becomes very large, hence too heavy and too expensive. Note that the expense of fabricating such mirrored surfaces increases (very approximately) with a cube of the length of the mirror. Also of course, the heavier the mirror, the more weight which the stage must support and hence more powerful motors are required to drive the stage, generating extra heat which must be removed and which degrades the accuracy of the positioning system due to thermal expansion of materials. Hence, a mirror 12 of the type shown in FIG. 1 is impractical for large substrates, i.e. 30 inch length or greater, of the type used in printed circuit board or flat panel display fabrication. It would be prohibitively expensive to fabricate a one piece mirror 12 as shown in FIG. 1 for a stage to support for instance a 60 inch length or longer substrate, which is the size likely to be used in the near future for flat panel displays. Hence there is a need for an interferometer mirror configuration which is less expensive and lighter and yet provides the needed precision for interferometry measurement.

SUMMARY

The present inventors have determined that it is desirable to use a two piece mirror, one of the reflective surfaces being located on each individual piece, for laser interferometry to locate a stage. Such "stick" mirror pieces are relatively light and inexpensive to fabricate. The present inventors have recognized that the problem is then presented how to determine precisely the orthogonality of the two separate mirrors to provide appropriate calibration and correction. This must be performed dynamically; it is to be understood that two separate mirrors may "drift" slightly independently over time in their relative location and orientation under the influence of different thermal conditions etc. and hence there is provided in accordance with the invention a means for updating a determination of the relative angle of the two mirrors.

The present inventors have found a method and apparatus to do this using a third reflective surface located at the end of one of the two stick mirrors and which is a calibration (reference) mirror. This third reflective surface, which is approximately parallel to the other reflective surface and is approximately orthogonal to the main reflective surface of the stick mirror on which it is located, allows determination of the angle $\alpha$ between the two stick mirrors and hence appropriate corrections for precise stage location. The third reflective surface is e.g. a polished surface on the end of the appropriate stick mirror, or a separate mirror which is rigidly attached to the associated stick mirror, e.g. by adhesive bonding or mechanically. Thus the angular relationship between the third (calibration) reflective surface and the stick mirror to which it is attached is rigid and thermally stable and the orthogonality error, 90-$\alpha$, can be calibrated and recorded one time. The calibration reflective surface then is a reference for the other stick mirror (to which it is not attached) to determine the exact relationship at any given time between the reflective surfaces of the two stick mirrors and hence a precise determination of the location of the stage.

It is to be understood that the use of interferometry in accordance with the invention is not limited to laser interferometry. Moreover, the references herein to a "stage" refer to any movable object whose location is determined interferometrically, and is not limited to stages for lithography equipment.

DETAILED DESCRIPTION

Figure 1:
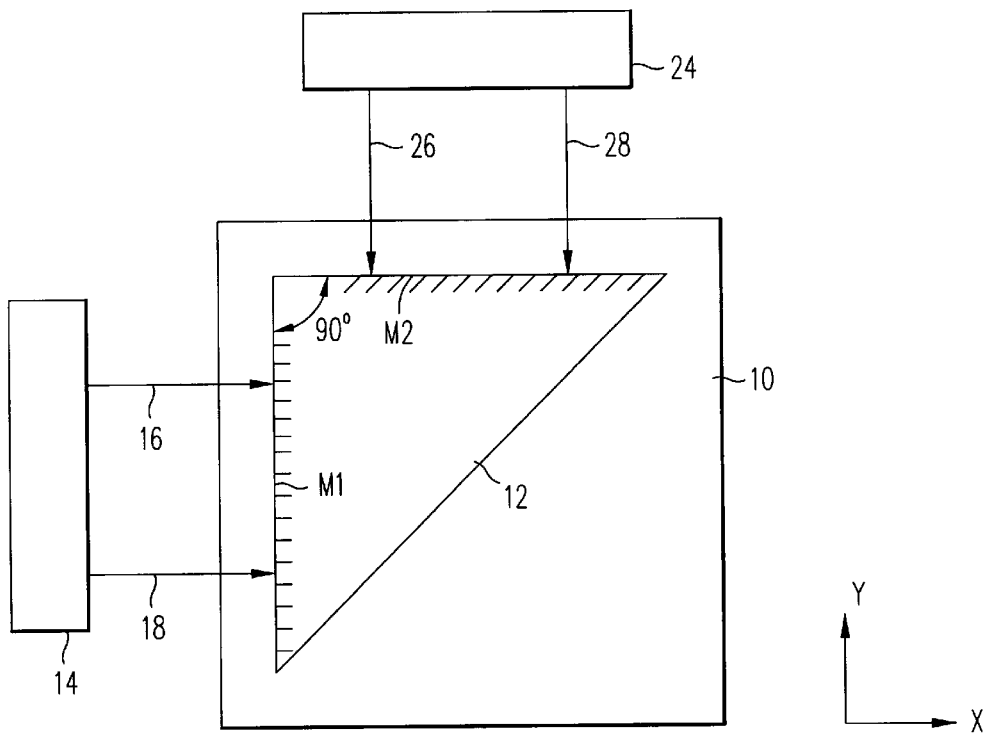
FIG. 1 shows a prior art interferometry arrangement for a stage.
Figure 2:
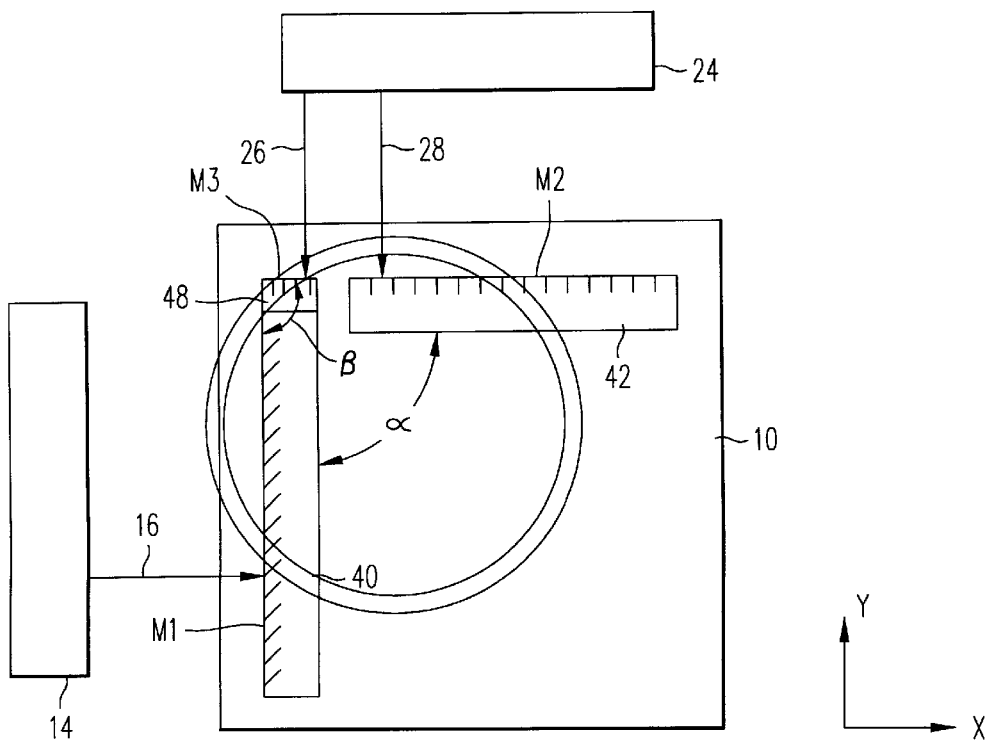
FIG. 2 shows an interferometry arrangement in accordance with the present invention using three mirrors in two rigid pieces.

FIG. 2 shows diagrammatically a mirror arrangement in accordance with this invention; elements identical to those of FIG. 1 have identical reference numbers. In this case only two laser beams are shown incident on surfaces M1, M2, i.e. beams 16 and 26, but there may be other beams as shown in FIG. 1 incident upon the main reflective surfaces M1, M2. Reflective surfaces M1, M2 are located respectively on elongated (e.g. stick) mirrors 40 and 42 which are separate optical elements fabricated independently and hence of relatively low cost and light weight. As can be seen, the bulk of the material of the triangular mirror 12 of FIG. 1 is not present here; this substantially reduces the weight of the mirror arrangement.

In the arrangement of FIG. 2, a third reflective surface M3 is located on the end of mirror 40. In one embodiment surface M3 is a polished surface on the end of a single glass structure 40. In another embodiment (depicted here) the third reflective surface M3 is a polished surface on a separate mirror structure 48 which is then rigidly attached, e.g. by adhesive bonding or by a rigid mechanical mount, to the end of mirror 40. The important thing is not so much how reflective surface M3 is attached to mirror structure 40 but that it is held in a rigid relationship thereto; thus in another embodiment reflective surface M3 is an optical element not actually attached to mirror 40 but is held away by a suitable rigid mechanical mount. It is believed more effective to have reflective surface M3 either rigidly attached to or an actual integral surface of mirror structure 40. One of the laser beams 26 emanates from the Y direction mount 24 and in this position of stage 10 is incident upon the third reflective surface M3. This beam 26 is reflected from surface M3 back into mount 24 and is received by suitable receiving optics therein while the other laser beam 28 is reflected from mirror M2.

Thus in this arrangement there are three reflective surfaces, two long elongated surfaces M1, M2 at angle $\alpha$ (e.g. 900) to one another and a third calibration surface M3.

Therefore there is a well defined and unchanging relationship between the angle of the calibration reflective surface M3 and the reflective surface M1 of the long mirror structure 40. The orthogonality error (departure from 90) between these two mirrors is 90°-$\beta$ which is determined once and then is recorded in the software for the control apparatus for the interferometer. Thus the calibration surface M3 in effect is a reference mirror for the second elongated reflective surface M2.

Either a single beam or a two-beam laser interferometer may be used incident on reflective surface M1. However in accordance with the invention a two-beam laser interferometer is used as shown having two beams 26 and 28 incident on reflective surfaces M3, M2. During normal interferometer operation (not shown), both of beams 26, 28 are incident on reflective surface M2 to monitor any drift in the angle of surface M2. During a calibration process for the interferometer, beams 28 and 26 are incident on respectively reflective surfaces M2 and M3. This is achieved by moving stage 10 appropriately into the illustrated calibration position, described further below. The output signal from the two-beam laser interferometer including beams 26 and 28 is transmitted to angle detection circuitry which is conventional and is available commercially for exactly measuring the angle between surfaces M3 and M2.

Figure 3A:
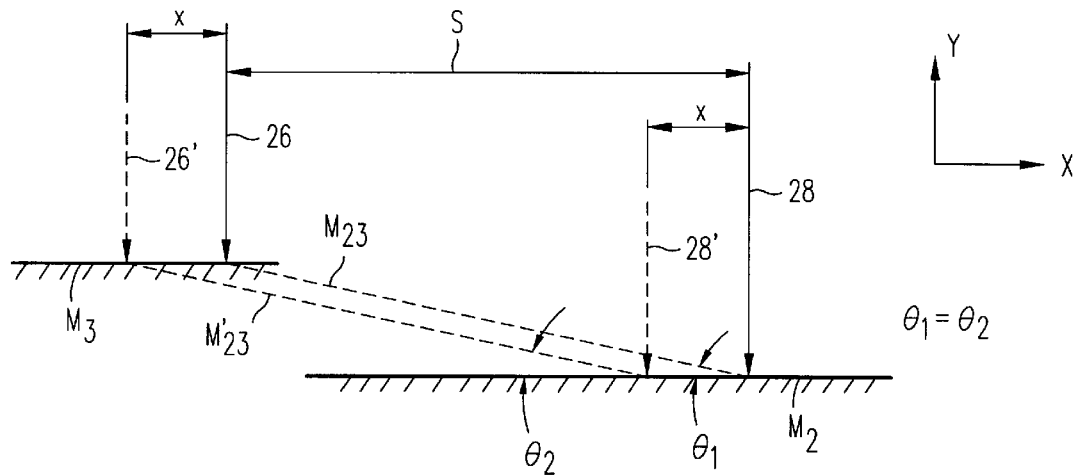
FIGS. 3A and 3B show diagrammatically a process for determining a angular relationship between the reference (calibration) reflective surface and the associated reflective surface of one of the stick mirrors.
Figure 3B:
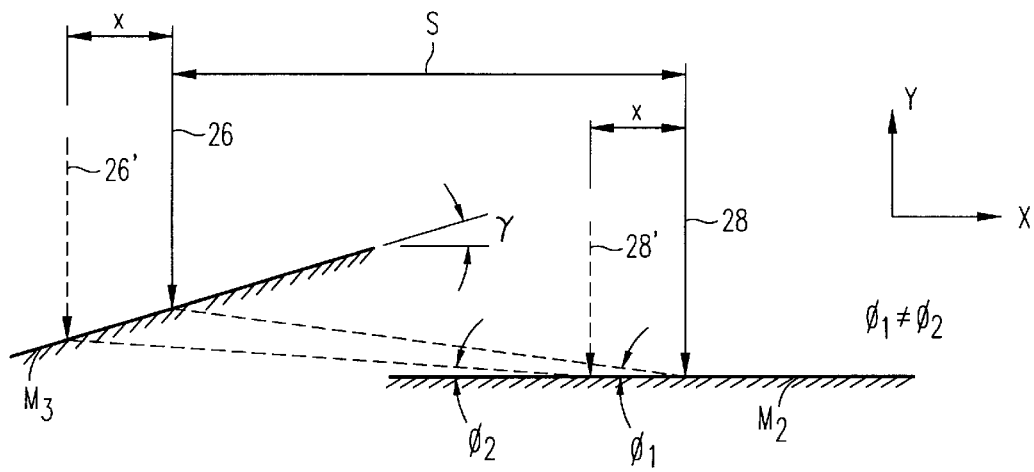

This is illustrated in FIGS. 3A and 3B illustrating the angular relationships between reflective surfaces M2 and M3 of FIG. 2; the remaining structure of FIG. 2 is omitted. In FIGS. 3A, 3B the displacement as well as angle between the nominally parallel surfaces M2 and M3 is exaggerated greatly. As shown in FIG. 3A, in a first position of the stage 10, beams 26 and 28 are respectively incident on surfaces M3 and M2. At this position, the effective surface which the two beam laser interferometer, 24, 26, 28, is monitoring is indicated by the dotted line $M_{23}$ which is oriented at an angle $\theta_1$ to the interferometer. Note that angle $\theta_1$ is determined by the displacement between the footprints of laser beams 26, 28 and by the separation between beams 26, 28. When surfaces M2 and M3 are substantially parallel and co-planar, angle $\theta_1$ approaches zero. The stage then translates to the left (along the X direction) so that now the beams 26, 28 move respectively to positions 28' and 26' which represent the same beams after the stage 10 is translated, are also incident respectively on different parts of surfaces M3 and M2. This then determines an effective surface $M'_{23}$ at an angle $\theta_2$. In this case surface M3 is parallel to surface M2, angle $\theta_1$ equals $\theta_2$, as shown. Hence the laser beams 26,28 detect no angular rotation on the reflective surfaces M2 and M3, indicating that M2 is parallel to M3 thus the angle a is the same as angle β.

The other situation when surface M2 is no longer parallel to surface M3 is shown in FIG. 3B. In this case angles $\phi_1$ (before stage translation) and $\phi_2$ (after stage translation) are different, due to the nonparallelism between surfaces M2 and M3; this angle difference is readily observed by comparison of the distances traveled along, the Y direction measured by beams 28 and 26 in the two positions of the stage 10. Hence in this case it is possible to determine the amount by which surface M1 is out of orthogonality with surface M2, since it is known exactly what is the angle between surfaces M3 and M2. Hence this allows determination of the angle α in FIG. 2 and hence accurate correction for both X and Y direction interferometer measurements of the location of stage 10.

Since in practice, the reflective surfaces M2 and M3 are almost parallel with very small angular error likely (on the order of ten arc-seconds), and the laser beams 26, 28 are nearly perpendicular to the surfaces M2, M3 within a few minutes, the angle γ between the mirror surfaces can be calculated by $$\gamma = (\tan \phi_1 - \tan \phi_2) \; S/X \cong (\phi_1 - \phi_2) \; S/X$$

where S is the separation between laser beams 26, 28; X here is the distance of travel between beam positions 26 and 26' or 28 and 28'; and $(\phi_1-\phi_2)$ is the measured angular rotation by the laser interferometer while the stage travels a distance X. Note that the interferometer only measures angle $(\phi_1-\phi_2)$ without measuring the value of $\phi_1$ or $\phi_2$.

An alternative measurement means is to operate laser interferometer beams 26, 28 as two independent linear position sensors along the Y direction. The angle is simply (d1−d2)/X where d1 and d2 are the distance of travel along Y measured by laser beams 26 and 28 respectively.

It is to be understood that the actual calculations herein are typically undertaken by computer code which is a part of the computer program executed by the microprocessor or microcontroller which controls the actual movement of stage 10 and is conventionally a part of such a system. Such a microcontroller or microprocessor is interconnected with the interferometer system and allows feedback control for motion of the stage 10 as its position is determined by the interferometer system. Thus the calculations described above are an additional part of the otherwise conventional interferometer control program. While the actual computer code for carrying this out is not shown herein, writing such code would be well within the skill of one of ordinary skill in the art in light of this disclosure.

The actual dimensions of the reflective surfaces involved herein are not critical and of course in general are dependent upon the actual size of stage 10 and its total amount of travel (movement) in the X and Y directions. The required width of the reference reflective surface M3 is that it is wide enough to allow a reasonably long distance of travel, X, to allow sufficient accuracy in determining for a given precision of $(\phi_1-\phi_2)$. The reference surface M3 is optically flat, i.e. having the same flatness criteria as the main reflective surfaces M1 and M2. In accordance with this invention, the angle α between mirror structures 40 and 42 need not be exactly 90°; as long as it is reasonably close to 90°, the present orthogonality correction using reflective surface M3 will suitably adjust for a slight deviation. This makes fabrication of this mirror arrangement substantially easier since it need not be optically aligned to great precision in terms of the location of mirror structures 40 and 42.

It is to be understood that a recalibration using the reference surface M3 is undertaken periodically during operation of the lithography system of which stage 10 is a part, to find the angle between reflective surfaces M3 and M2. For instance this might take place every few minutes or hours to compensate for any drift in the relative position of mirror structures 40 and 42, due for instance to thermal effects.

This disclosure is illustrative and not limiting; further modifications will be apparent to one skilled in the art in the light of this disclosure and are intended to fall within the scope of the appended claims.

What is claimed is:

1. A stage assembly comprising:
 a stage movable in first and second directions;
 a first reflective surface on the stage and oriented to reflect at least one incident
 interferometer beam having an axis extending in the first direction;
 a second reflective surface on the stage and oriented to reflect at least one incident interferometer beam having an axis extending in the second direction; and a third reflective surface having a fixed relationship with respect to the first reflective surface and spaced apart from the second reflective surface and oriented to reflect an interferometer beam having an axis extending in the second direction.

2. The stage assembly of claim 1, wherein the first reflective surface is an elongated mirror extending in the second direction, and the third reflective surface is a polished reflective surface on an end of the elongated mirror.

3. The stage assembly of claim 1, wherein the first reflective surface is an elongated mirror extending in the second direction, and the third reflective surface is a mirror adhesively bonded to an end surface of the elongated mirror.

4. The stage assembly of claim 1, wherein each of the first and second reflective surfaces are a surface of respective first and second elongated mirrors, the first and second elongated mirrors being spaced apart.

5. The stage assembly of claim 1, wherein the third reflective surface is at a right angle to the first reflective surface.

6. The stage assembly of claim 1, further comprising means for determining an angle between the first and second reflective surfaces from the interferometer beam incident on the third reflective surface.

7. A method of determining a location of a stage movable in two directions, comprising the steps of:
 detecting first and second interferometer signals reflected from respectively first and second reflective surfaces on the stage, the first and second reflective surfaces being at an angle to one another;
 detecting a third interferometer signal reflected from a third reflective surface on the stage, the third reflective surface being held in a fixed relation to the first reflective surface; and
 determining the angle between the first and second reflective surfaces from the third interferometer signal.

* * * * *